(12) United States Patent
Noguchi et al.

(10) Patent No.: US 7,964,957 B2
(45) Date of Patent: Jun. 21, 2011

(54) CIRCUIT SUBSTRATE, CIRCUIT DEVICE AND MANUFACTURING PROCESS THEREOF

(75) Inventors: Mitsuru Noguchi, Ota (JP); Sadamichi Takakusaki, Ota (JP)

(73) Assignees: SANYO Electric Co., Ltd., Moriguchi-shi (JP); SANYO Semiconductor Co., Ltd., Ora-gun (JP)

( * ) Notice: Subject to any disclaimer, the term of this patent is extended or adjusted under 35 U.S.C. 154(b) by 31 days.

(21) Appl. No.: 12/342,363

(22) Filed: Dec. 23, 2008

(65) Prior Publication Data

US 2009/0166895 A1   Jul. 2, 2009

(30) Foreign Application Priority Data

Dec. 26, 2007   (JP) ................. 2007-334237

(51) Int. Cl.
*H01L 23/24* (2006.01)
(52) U.S. Cl. ...................... 257/699; 257/684
(58) Field of Classification Search .............. 257/699, 257/706, 707, 684
See application file for complete search history.

(56) References Cited

U.S. PATENT DOCUMENTS

| | | | | |
|---|---|---|---|---|
| 3,820,153 | A | * | 6/1974 | Quinn .................... 257/724 |
| 5,294,826 | A | * | 3/1994 | Marcantonio et al. ........ 257/659 |
| 6,028,358 | A | * | 2/2000 | Suzuki ................... 257/737 |
| 7,232,957 | B2 | | 6/2007 | Mizutani et al. |

FOREIGN PATENT DOCUMENTS

| | | |
|---|---|---|
| JP | 6-79689 | 3/1994 |
| JP | 7-142861 | 6/1995 |
| JP | 10-22630 | 1/1998 |
| JP | 2003-318334 | 11/2003 |
| KR | 10-0613792 | 8/2006 |

\* cited by examiner

*Primary Examiner* — S. V Clark
(74) *Attorney, Agent, or Firm* — Morrison & Foerster LLP (57) ABSTRACT

A semiconductor device that includes a metal substrate including a top surface, a bottom surface and four side surfaces, a conductive pattern insulated from the metal substrate, and a semiconductor element mounted on and electrically connected to the conductive pattern. The top surface is insulated. Each of the side surfaces of the metal substrate includes a first inclining side surface and a second inclining side surface so as to form a convex shape protruding outwardly between the top surface and the bottom surface of the metal substrate, and the first inclining side surfaces of a pair of two opposing side surfaces are smaller than corresponding first inclining side surfaces of another pair of two opposing side surfaces.

22 Claims, 11 Drawing Sheets

CIRCUIT SUBSTRATE, CIRCUIT DEVICE AND MANUFACTURING PROCESS THEREOF

This application claims priority from Japanese Patent Application No. 2007-334237, the content of which is incorporated herein by reference in its entirety.

BACKGROUND OF THE INVENTION

1. Field of the Invention

This invention relates to a circuit substrate and a circuit device and manufacturing process therefor. Especially, this invention relates to a circuit substrate and a circuit device on which plurality of circuit elements are mounted, and manufacturing process thereof.

2. Description of the Related Art

Previously, such method of separating each unit has been adopted: a conductive pattern which consists of a lot of units is formed on one large substrate, this conductive pattern is connected to circuit elements and, after that, each unit is separated (refer to the following patent document 1).

Figure 10A:
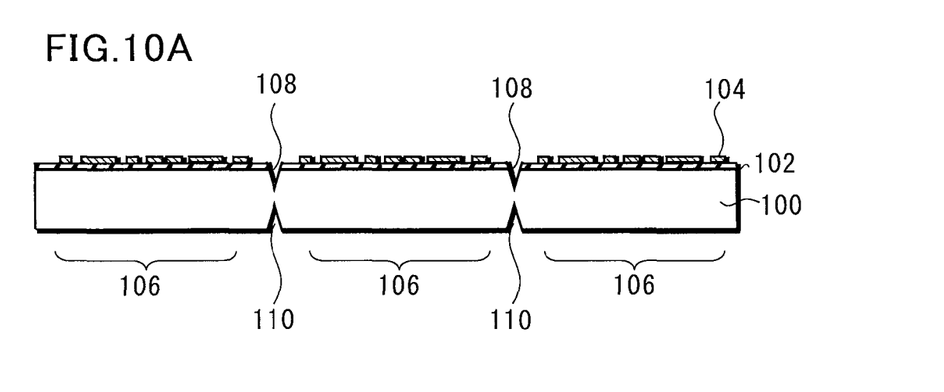
Figure 10B:
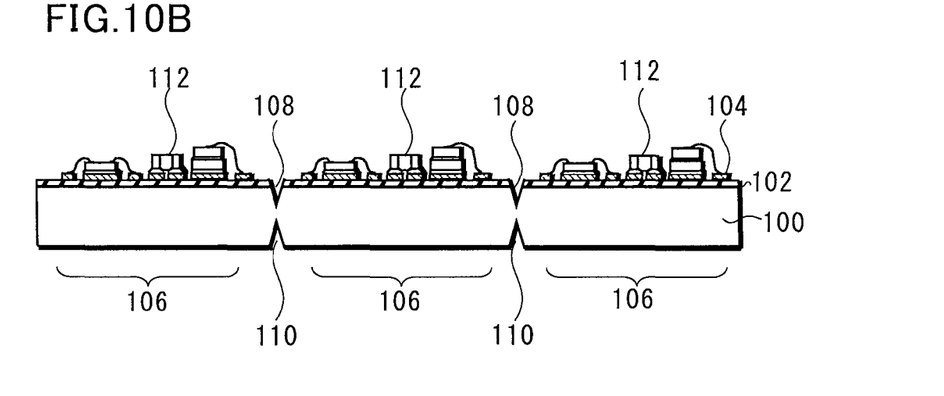
Figure 10C:
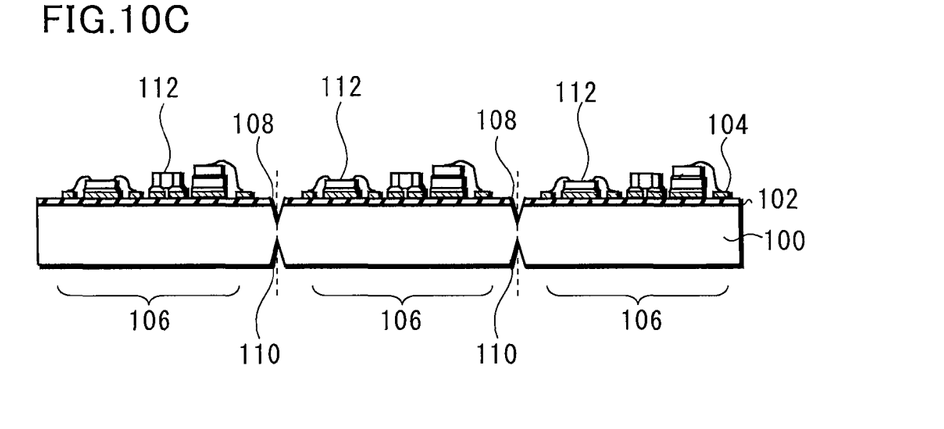

Referring to FIG. 10, previous circuit substrates and manufacturing method thereof will be described. FIG. 10(A), FIG. 10(B) and FIG. 10(C) are cross section view where each process is shown.

Firstly, referring to FIG. 10(A), a conductive pattern 104 which consists of a lot of units 106 are formed on the top surface of a substrate 100. The first groove 108 on the top surface and the second groove 110 on the back surface are formed on the border between each unit 106.

The average size of the substrate 100 is such that a lot of units 106 are formed on, for example, a substrate which consists of aluminum of about 1.5 mm thickness is applied. The top surface of such substrate 100 is covered with an insulating layer 102 that consists of the resin material with which filler is mixed.

On the top surface of the insulating layer 102, the conductive pattern formed in predetermined pattern by means of etching conductive film of a few tens of μm thickness. Here, the unit 106 is a unit element that consists of one circuit device, and same shape of conductive patterns 104 are formed on each unit 106. Plurality of units 106 are arranged in a grid on the substrate 100 though it is not shown in any figure here.

The first groove 108 is a groove formed on the top surface of the substrate 100 along with the border of each unit 106, and it has a cross section shape of V-type. Since the unit 106 is formed in a grid on the substrate 100, the first groove 108 provided between each unit 106 is formed in a grid. Here, when the thickness of the substrate 100 is 1.5 mm, the depth of the first groove 108 will be formed about 0.6 mm.

The second groove 110 is provided on the back surface of the substrate 100 corresponding to the place where the first groove 108 is formed. The width and the depth of the second groove 110 are formed same as the first groove 108.

Said first groove 108 and second groove 110 are formed by cutting the substrate 100 partially with the use of a cut saw rotating at high speed.

Next, referring to FIG. 10(B), circuit elements 112 are connected with the conductive pattern 104 of the each unit 106. Here, semiconductor elements such as transistor or IC and chip elements such as chip resistances and chip capacitors are shown as the circuit elements 112. The semiconductor element such as IC is connected with the conductive pattern 104 via thin metallic wire.

Then next, referring to FIG. 10(C), each unit 106 is cut off by dividing the substrate 100 at the place where the first groove 108 and the second groove 110 are provided. Because the thickness of the substrate 100 is locally thin in the area where the first groove 108 and the second groove 110 are provided, the substrate 100 can be easily separated in this area. There are some methods for dividing the substrate 100; for example, the substrate 100 is folded and divided in the area where both of the grooves are provided, then, diced, and so on.

After the above process of separation is completed, leads are bonded to pads which consist of the conductive pattern 104, the circuit element 112 and the substrate 100 are sealed with a use of sealing resin or casing material, then the circuit device is completed.

It is capable that many of circuit devices are efficiently manufactured by using the above mentioned method.

Next, referring to FIG. 11(A), the construction of the substrate 100 and the circuit device manufactured by the above mentioned manufacturing method will be described. First of all, the side surface of the substrate 100 made in the above mentioned manufacturing process has inclinations. Specifically, the side surface of the substrate 100 is composed of the first side surface 118 which is adjacent and inclined from the top surface and the second side 120 which is adjacent and inclined from the back surface. Here, the sizes of the first side surface 118 and the second side surface are equal. Moreover, the pad 116 that forms conducting pattern 104 like land is provided in the surrounding portion of the substrate 100, and the lead 114 is attached to the pad 116.

Moreover, the other methods have been proposed as methods of separating the substrate 100. For instance, refereeing to the patent document 2, the fact that it becomes easy to separate each metal substrate 2 from a metal substrate body 1 by separating the metal substrate 2 and creating the groove 3 which penetrates through the metal substrate body 1 is disclosed.

In addition, a printed circuit substrate dividing machine is disclosed in the patent document 3. Especially, it is disclosed that print circuit substrate 4 is separated by using rotary blades 31 and 32 in FIG. 1 of this document.

Moreover, referring to the patent document 4, the method of the separation of metal base print circuit substrate is disclosed. Especially, referring to the process chart shown in FIG. 1 of this document, firstly, a V-cutting groove 6 is created in the separation part a of the metal base circuit substrate 2 of which the top surface is covered by an insulating layer 3. Then, the metal base circuit substrate 2 is separated by adding the stress in the part where the V-cutting groove 6 was created after the insulating layer 3 upon the V-cutting groove 6 is removed by the laser.

Japanese Patent Publication Nos. 2003-318334, H7-142861, H6-79689 and H10-22630 describe the structures described above.

Figure 11A:
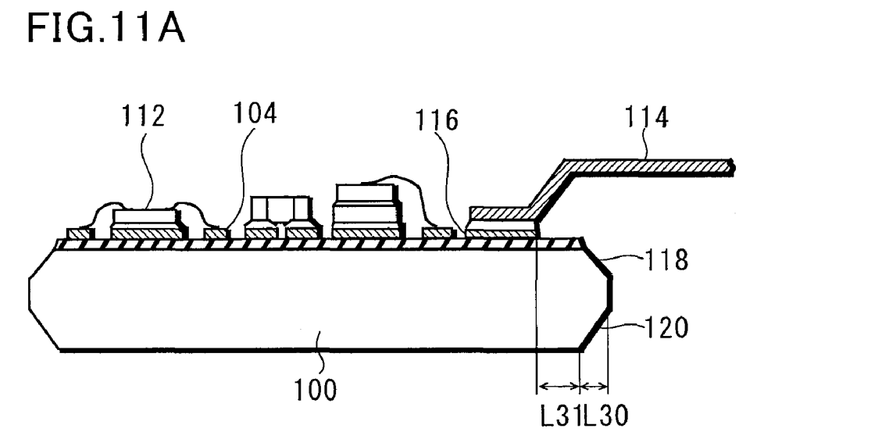

However, there was the problem that it is difficult for the structure of the substrate 100 shown in FIG. 11(A) to achieve both high-voltage and downsizing. Specifically, the sizes of the first side surface 118 and the second side surface 120 are in the same level as described above, and the width L 30 of the both surfaces is about 0.3 mm. In addition, it is necessary to place a certain distance between the edge part of the substrate 100 in which metallic material is exposed and the pad 116 in order to secure withstand voltage. For instance, the distance L 31 between them is about 0.5 mm. In addition, because the first side surface 118 and the second side surface 120 are inclined equally and protrude outside, the dimension of the substrate 100 becomes large and the downsizing of the entire device becomes difficult.

Figure 11B:
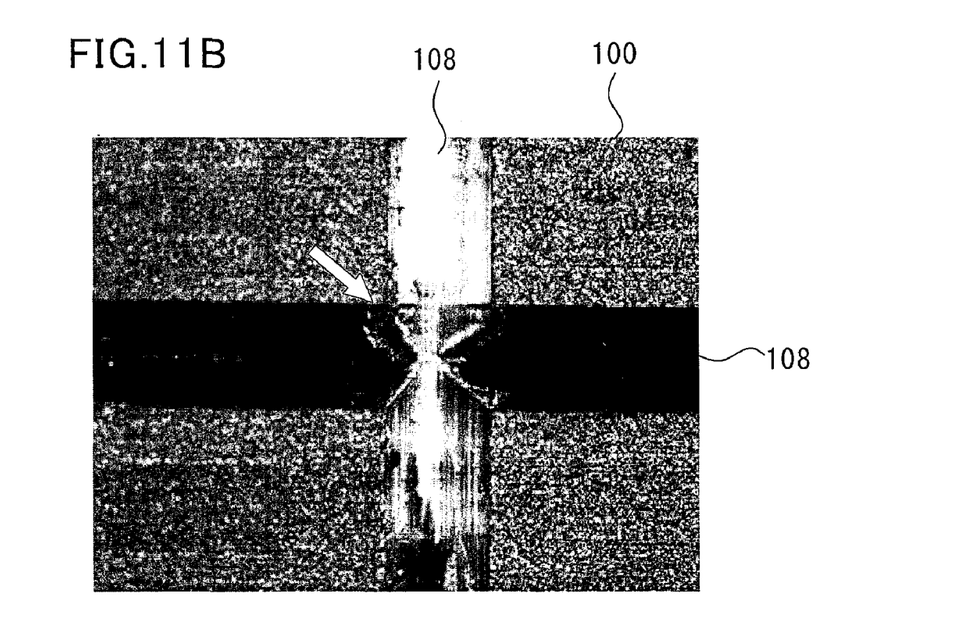

Referring to FIG. 11 (B), if the first grooves 108 which have equal depth are created in a grid on the substrate 100, there is a possibility of arising metallic burr at the part where the first grooves 108 intersect each other at a right angle. This metallic burr would be removed by means of spraying vapor or liquid in high pressure, however, it is difficult to remove all of the metallic burr. And if conductive metallic burr remains in the substrate 100, it drops on the substrate directly in the manufacturing process and picks up other metallic burr on a line, and it becomes attached to a circuit device as a product, and short-circuit might happen.

This invention is accomplished in view of the above mentioned problem and is directed to providing the circuit substrate and circuit device which achieve a good balances between withstanding high-voltage and downsizing and process method thereof.

SUMMARY OF THE INVENTION

The invention provides a circuit substrate that includes a metal substrate including a top surface, a bottom surface, a first side surface and a second side surface, an insulating layer covering the top surface of the metal substrate, and a conductive pattern formed on the insulating layer. The first side surface includes a first inclining side surface inclining from the top surface and a second inclining side surface inclining from the bottom surface, and the first inclining side surface is shorter in a corresponding inclining direction thereof than the second inclining side surface in a corresponding inclining direction thereof.

Alternatively, the first side surface includes a first inclining side surface inclining from the top surface, the second side surface includes a second inclining side surface inclining from the top surface, and the first inclining side surface is shorter in a corresponding inclining direction thereof than the second inclining side surface in a corresponding inclining direction thereof.

The invention also provides a circuit substrate that includes a metal substrate including a top surface, a bottom surface, a first side surface, a second side surface opposite from the first side surface, a third side surface and a fourth side surface opposite from the third side surface, an insulating layer covering the top surface of the metal substrate, and a conductive pattern formed on the insulating layer. The first side surface includes a first inclining side surface inclining from the top surface, the second side surface includes a second inclining side surface inclining from the top surface, the third side surface includes a third inclining side surface inclining from the top surface, the fourth side surface includes a fourth inclining side surface inclining from the top surface, and the first and second inclining side surfaces are shorter in corresponding inclining directions thereof than the third and fourth inclining side surfaces in corresponding inclining directions thereof.

The invention further provides a semiconductor device that includes a metal substrate including a top surface, a bottom surface and four side surfaces, the top surface being insulated, a conductive pattern insulated from the metal substrate, and a semiconductor element mounted on and electrically connected to the conductive pattern. Each of the side surfaces of the metal substrate includes a first inclining side surface and a second inclining side surface so as to form a convex shape protruding outwardly between the top surface and the bottom surface of the metal substrate, and the first inclining side surfaces of a pair of two opposing side surfaces are smaller than corresponding first inclining side surfaces of another pair of two opposing side surfaces.

The invention provides a method of manufacturing a circuit substrate. The method includes providing a conductive pattern corresponding to a plurality of circuit units on a top surface of a substrate, forming, in the top surface of the substrate, first grooves and second grooves that cross the first grooves and are shallower than the first groves so that the first and second grooves define regions of the circuit units, forming, in the bottom surface of the substrate, third grooves and fourth grooves that cross the third grooves and are deeper than the third groves so that the third grooves correspond to the first grooves and the fourth grooves correspond to the second grooves, and separating the circuit units from each other at the grooves.

BRIEF DESCRIPTION OF THE DRAWINGS

FIG. 1 is a drawing where the circuit substrate in this invention is shown; (A) is a oblique view, and (B) and (C) are cross section views.

FIG. 2 is a drawing where the hybrid integrated circuit device in this invention is shown; (A) is a oblique view, and (B) is a cross section view.

FIG. 3 is a drawing where the hybrid integrated circuit device in this invention is shown; (A) is a oblique view, and (B) and (C) are cross section views.

FIG. 4 is a drawing where the process of manufacture of the circuit device in this invention is shown; (A) is a plan view, and (B) and (C) are oblique views.

FIG. 5 is a drawing where the process of manufacture of the circuit device of this invention is shown; (A) is a oblique view, and (B) and (C) are cross section.

FIG. 6 is a drawing where the process of manufacture of the circuit device of this invention is shown; (A) is a plan view, and (B) is an image that shows metallic burr.

FIG. 8 is a drawing where the process of manufacture of the circuit device in this invention is shown; (A) and (B) are cross section views.

FIG. 10 is a drawing where the process of manufacture of the circuit device of the prior art is shown, (A), (B) and (C) are cross section views.

FIG. 11 is a drawing where (A) is the cross section view showing the circuit device of background technology, and (B) is an image that shows metallic burr.

DETAILED DESCRIPTION OF THE INVENTION

The First Embodiment

Structure of a Circuit Substrate and a Circuit Device

Figure 1A:
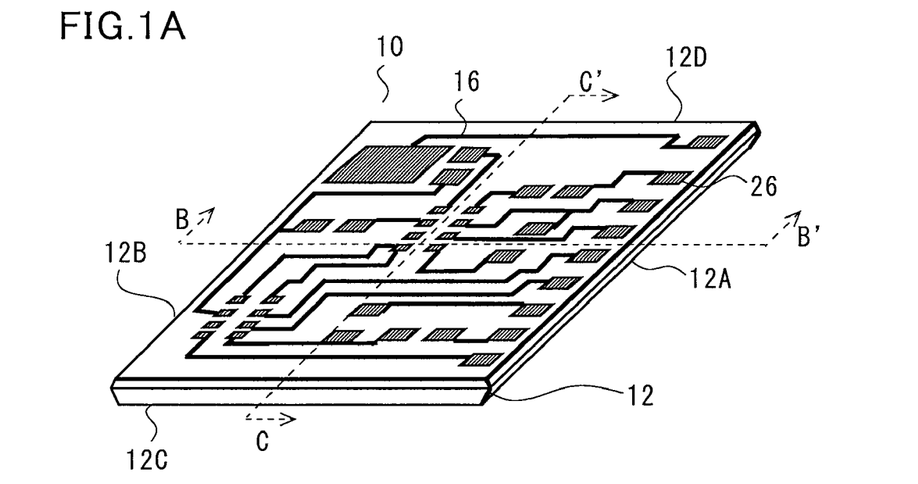
Figure 1B:
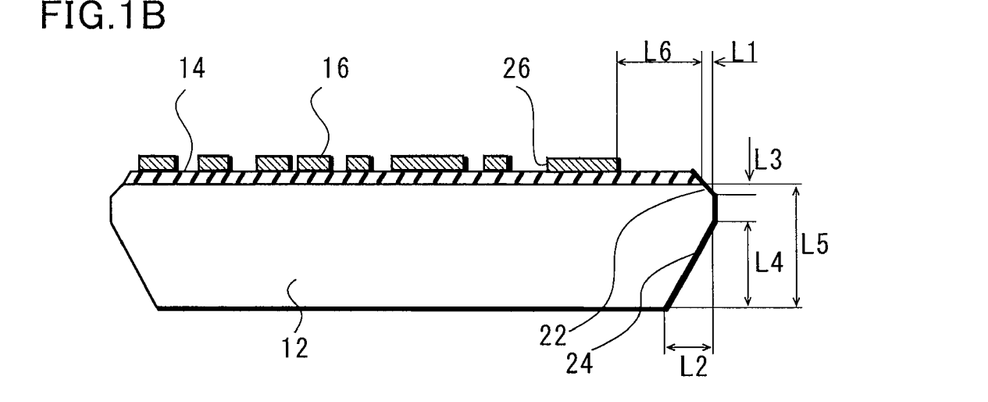
Figure 1C:
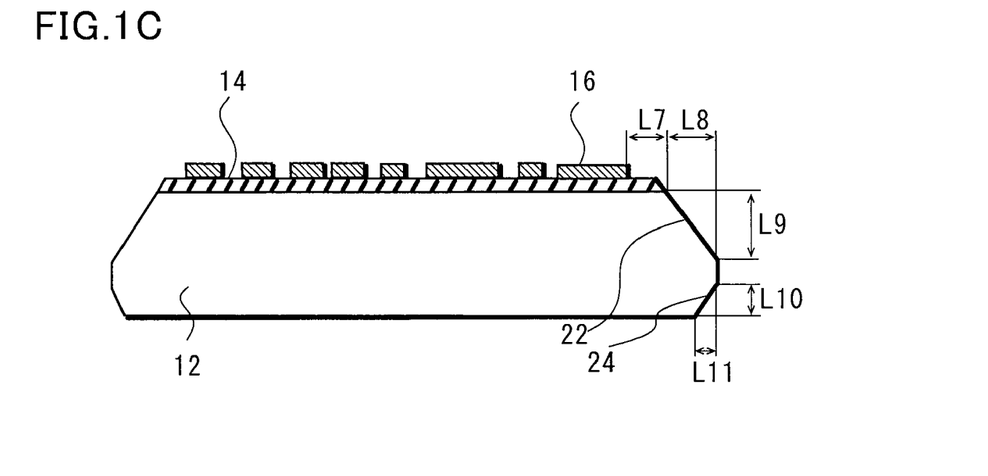

Referring to FIG. 1, it explains the structure of a circuit substrate 10 which embodies this invention. FIG. 1(A) is a oblique view of the circuit substrate 10 seen from the upper side, FIG. 1 (B) is the cross section view at the line between B and B' in FIG. 1(A), and FIG. 1(C) is the cross section view at the line between C and C' in FIG. 1(A).

Referring to FIG. 1, the circuit substrate 10 consists of metal substrate 12, an insulating layer covering the top surface of the metal substrate 12, and a conductive pattern 16 formed on the top surface of the insulating layer 14.

The metal substrate 12 is a substrate which consists of metal that is mainly made of aluminum or cupper, etc., and the size of dimension is, for example, about 1 cm×2 cm, The thickness of the metal substrate 12 is, for example, 1.5 mm.

When the metal substrate 12 consists of aluminum, the top and bottom surfaces are covered by alumite film formed by anodic oxidation. Or they may be covered by the insulating layer 14.

The insulating layer 14 is formed to cover the whole area of the top surface of the metal substrate 12 and consists of resin material to which filler such as grained alumina is highly filled. The thickness of the insulating layer 14 is about, for instance, 50 µm.

The conductive pattern 16 is formed by etching that etches conductive film such as cupper adhering to the top surface of the insulating layer 14. Referring to FIG. 1 (A), the conductive pattern 16 consists of the land connected to circuit element and the wiring connecting between lands or between pads. In addition, a pad 26 which consists of the conductive pattern 16 formed in pad style is, at least, formed along with the right side (the first side 12A) of the metal substrate 12. A lead which becomes input-output terminal is attached to this pad 26. In this figure, the pad 26 is formed along with the right side (the first side 12A) of metal substrate 12, but the pad 26 may be formed along with the second side 12B opposing to the first side 12A. Although the pads 26 for the leads are disposed side by side along the first side 12A in FIG. 1(A), the pads 26 may be disposed along both sides, or all around the four sides, of the metal substrate 12.

Referring to FIG. 1(A), the metal substrate 12 is a rectangular having four sides, specifically, it has the first side 12A and the second side 12B which are facing each other in lateral direction, and the third side 12C and the fourth side 12D which are facing each other in longitude direction. The first side 12A and the second side 12B are facing each other in longer direction and the third side 12C and fourth side 12D are facing each other in shorter direction. Then, the first side 12A and the second side 12B, the third side 12C and the fourth side 12D too, have different forms of side surface of the metal substrate 12 each other.

Referring to FIG. 1(B), it explains the shape of the side surface of the metal substrate 12 in the first side 12A and the second side 12B. The side surface of the metal substrate 12 in this cross section is formed a slope that protrudes outside. Specifically, the side surface of the metal substrate 12 has the first side surface 22 which is adjacent and inclined from the top surface to outside and the second side 24 which is adjacent and inclined from the bottom surface to outside. Then the width of the first side surface 22 is created narrower than that of the second side surface 24 in the first side surface 12A and the second side surface 12B. Specifically, the width L1 of the first side surface 22 is about 0.1 mm, on the other hand, the width L2 of the second side surface 24 is about 0.4 mm. Further, the thickness L3 of the first side surface 22 is about 0.2 mm and the thickness of the second side surface 24 is about 1.0 mm.

In FIG. 1(B), there is a perpendicular portion between the first side surface 22 and the second side surface 24. The perpendicular portion is located between an arrow L3 and an arrow L4. A region of the perpendicular portion is drawn by a straight line in FIG. 1(B). However, a shape of the perpendicular portion may be changed variously depending on a method of separating the substrate as described in FIG. 8. As a matter of course, the shape may vary depending on the separation methods, such as cutting with a round cutter, cutting with a laser, mechanical bending, and tearing apart.

In this shape, because the first side surface 22 is smaller than the second side surface 24 as described above, the size of the metal substrate may be restrained and withstand dielectric property between the pad 26 and the metal substrate 12 may be ensured. Specifically, because the side surface of the metal substrate 12 is such face that metal material such as aluminum, etc. is exposed, then, if the pad 26 is placed at the right edge of insulating layer 14, the metal substrate 12 and the pad 26 would short-circuit. Also, if the pad 26 is placed inward from the right edge of the insulating layer 14, a dead space in the top surface of the circuit substrate 19 would increase and it would be difficult to downsize the device.

In this shape, the first side surface 22 is smaller than second side surface 24, then the width L1 of first side surface 22 is narrow. This will make a useful dimension of top surface of the circuit substrate 10 for arranging the pads 26, etc. larger and an enlargement of the dimension of metal substrate 12 caused from separation between the pads 26 and the edge of the insulating layer 14 restrained. Specifically, when the distance L6 between the right edge of the insulating layer 14 and the pad 26 is about 0.8 mm or more, the necessary withstand dielectric is ensured. A simple calculation of area proves that the first side surfaces 22 provided along the first side 12A and the second side 12B each serving as a long side of the metal substrate 12 particularly have such a narrow width L1 that a mounting area of the metal substrate can be made large. In addition, since a large distance can be secured for the distance L6 between the pad 26 and the side surface of the metal substrate 12, it is possible to achieve improvement in the withstand voltage.

Referring to FIG. 1(C), magnitude relation between the first side surface 22 and the second side surface 24 of the third side 12C and the fourth side 12D (refer to FIG. 1(A)) is opposite to that of the first side 12A and the second side 12B. It means that the width and thickness of the first side surface 22 is larger than that of the second side surface 24. Specifically, the width of the first side surface L8 is about 0.4 mm, the height L9 is about 1.0 mm. In addition, the width L11 of the second side surface 24 is about 0.1 mm, the height L10 is about 0.2 mm.

Figure 2A:
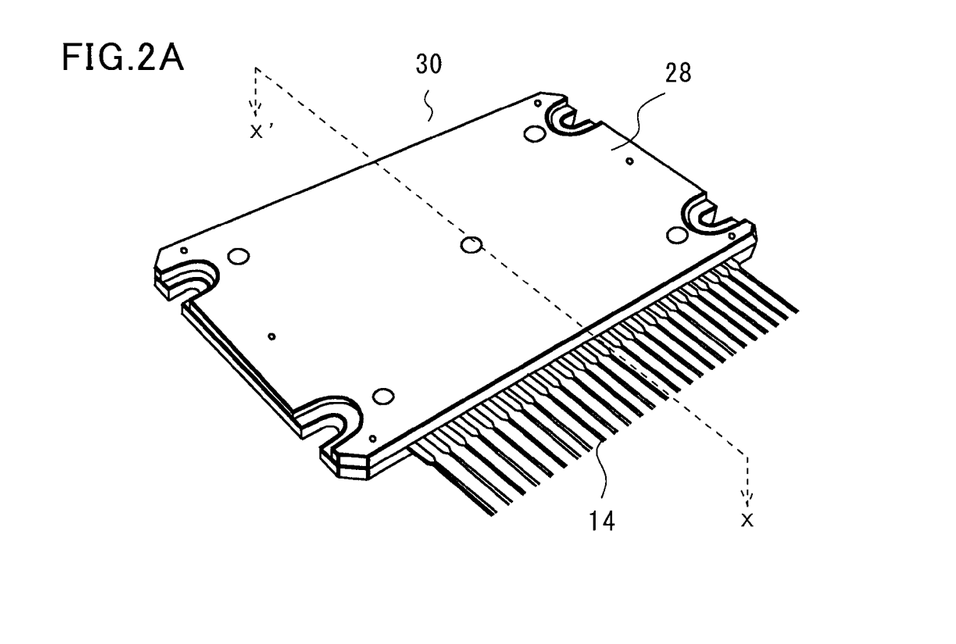
Figure 2B:
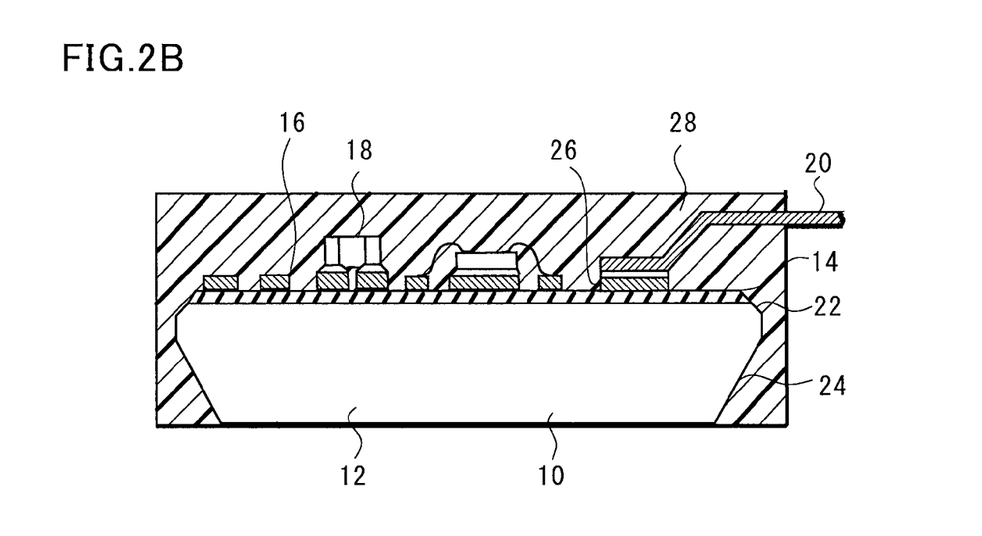

Next, referring to FIG. 2, it explains the structure of a hybrid integrated circuit device 30 (circuit device) to which the above mentioned circuit substrate 10 is applied. FIG. 2(A) is a oblique view seen from the upper side, and FIG. 2(B) is the cross section view on the line between X and X'.

Referring to FIG. 2(A) and FIG. 2(B), the top surface and side surface of the circuit substrate 10 are completely covered by sealing resin 28. In addition, a circuit element 18 electrically connected to the conductive pattern 16 on the circuit substrate 10 is covered with the sealing resin 28 too. The sealing resin 28 consists of the resin material in which filler such as grainy alumina is mixed. Here, thermosetting resin such as epoxy resin and thermoplastic resin such as acrylic resin are adopted as resin material of the sealing resin 28. Here, to improve heat radiation, the bottom surface of the metal substrate 12 is exposed to outside without being covered with the sealing resin 28. However, to improve withstanding voltage, the bottom surface of the metal substrate 12 may be covered with the sealing resin 28.

In this embodiment, the side surface of the metal substrate 12 consists of the first side surface 22 and the second side surface 24 that are slopes protruding outside. Therefore, there is an advantage that peel-off of the sealing resin 28 from the circuit substrate 10 may be restrained by generating the effect of anchor between the first side surface 22 and the second side surface 24 and the sealing resin 28.

An edge of the lead 20 is attached to the top surface of the pad 26 formed on the top surface of the circuit substrate 10 through electroconductive bonding material such as solder, and the other edge of the lead 20 is exposed from the sealing resin 28 to the outside. As described above, because the pad 26 is distant enough from the edge (side of the metal substrate 12 where metal material is exposed) of the insulating layer 14, the withstanding voltage of them is ensured enough. Therefore, even if a high voltage is impressed from the lead 20 to the pad 26, the short circuit of the metal substrate 12 and the pad 26 may be prevented.

The circuit elements 18 are mounted through electroconductive bonding material such as solder on a predetermined place of the conductive pattern 16. A passive element, active element or the resin-sealed type package, etc. can be adopted as the circuit elements 18 in general. Moreover, when a transistor of the power type is mounted, the element is mounted on the heat sink that is attached on the conductive pattern. Moreover, a semiconductor element such as IC is connected to the conductive pattern 16 through thin metallic wire.

Moreover, referring to FIG. 2(B), it is also favorable that the insulating layer 14 is partially removed and an opening is created there and the conductive pattern 16 and the metal substrate 12 are connected through the opening. The metal substrate 12 can be a fixed potential (for instance, power supply potential and earth potential) by this for the reason of preventing capacitor generating between the metal substrate 12 and conductive pattern 16.

Various electric circuits can be installed in the above mentioned hybrid integrated circuit device 30. For instance, inverter circuits and audio power amplifiers, etc. are constructed from circuit the elements 18 and the conductive pattern 16 formed on the top surface of the circuit substrate 10. In particular, the inverter circuits are important in reducing electric power consumption, and the metal substrate 12 is suitable to mounting of large-electric power switching elements necessary for the inverter circuits. For this reason, a device manufactured according to the present invention is an important technology, also in a sense of environmental conservation in the future.

Figure 3A:
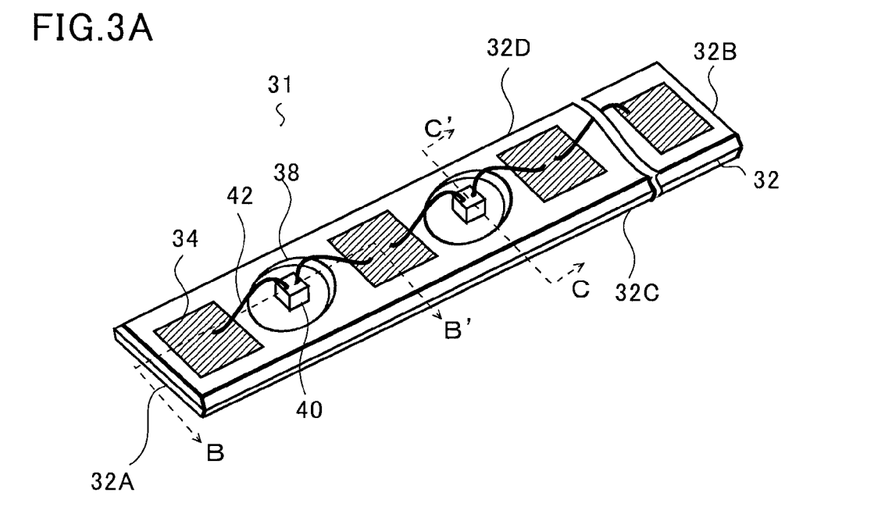
Figure 3B:
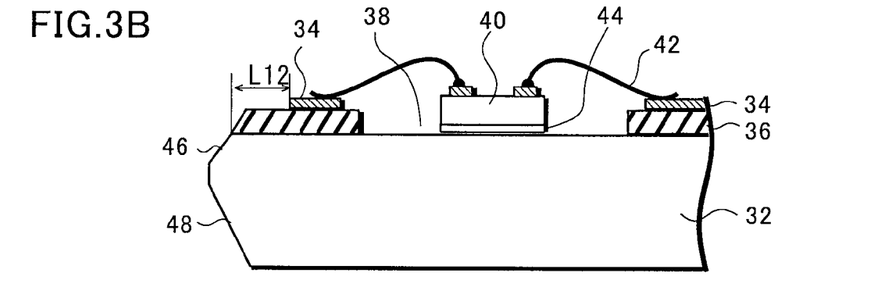
Figure 3C:
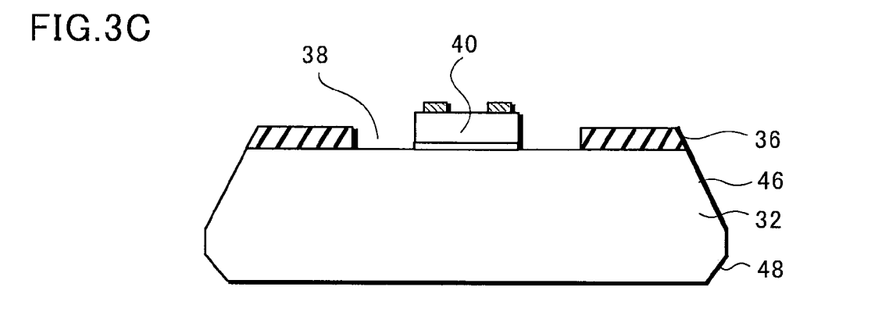

Referring to FIG. 3, it explains the construction of a circuit device 31 in another form. FIG. 3(A) is a oblique view of the circuit device 31 seen from the upper side, FIG. 3 (B) is the cross section view on the line between B and B" and FIG. 3 (C) is the cross section view on the line between C and C'.

Referring to FIG. 3(A) and FIG. 3(B), the basic structure of the circuit device 31 is common with the above mentioned hybrid integrated circuit device 30, but the difference is that a lot of light emitting elements 40 are arranged on the top surface of a metal substrate 32. Specifically, the circuit device 31 is composed of the metal substrate 32 which consists of aluminum or copper, etc., the insulating layer covering the top surface of this metal substrate 32, the conductive pattern 34 and the light emitting elements 40 electrically connected with the conductive pattern 34. This means that the circuit device 31 explained here operates as an illuminator by providing a lot of light emitting elements 40. In particular, in the future, the circuit device 31 is a promising device used for a backlight in a computer employing an LCD display, and for an illuminator in a house or building. The present device is also considered promising for an illuminator with low electric power consumption, and is an important technology, also in a sense of environmental conservation in the future.

Referring to FIG. 3(A), a dimensional size of the metal substrate 32 composed of the circuit devices 31 is, for instance, that length×side=about 20 cm×(0.5~1.0 cm) and its shape is extremely long and slender rectangle. And, the metal substrate 32 provides with the first side 32A and the second side 32B opposed each other in the shorter direction and the third side 32C and the forth side 32D opposed in the longer direction.

The top surface of the metal substrate 32 is covered with an insulating film 36, and a conductive pattern is formed on the top surface of the insulating film 36. Referring to FIG. 3(A), the conductive pattern 34 is arranged in the row along the longer direction of the metal substrate 32, and the conductive pattern 34 arranged at both edges functions as pads connected to outside. The light emitting elements 40 that are LED are mounted on the top surface of the metal substrate 32, and the electrode formed on the top surface of light emitting elements 40 is connected with the conductive pattern 34 via a metallic thin wire 42. Here, all the light emitting elements 40 may be connected in series via the metal thin line 42 and the conductive pattern 34. In general, there are two types of LED devices. The first type is a type shown in FIG. 3, in which an anode electrode and a cathode electrode are provided on a chip top surface. Meanwhile, the second type is a type in which an anode (or cathode) electrode is provided on a top surface of the chip, and a cathode (or anode) electrode is provided on a bottom surface of the chip. A serial connection is usually used for a connection method of the LEDs; however, a parallel connection is also sometimes used therefor. A conductive pattern formed on the metal substrate 32 varies depending on the connection method. Here, an explanation of the connection method is omitted because the method is not critical to the present invention. However, a conductive island is necessary for the second type device.

The light emitting elements 40 are arranged internally in an opening 38 that is created by removing the insulating film 36 partially and is mounted on the metal substrate 32 directly. Here, material in good thermal conductivity such as solder, etc. is adopted as adhesive material 44 which is used to mount the light emitting elements 40. Laser diodes are applicable instead of light emitting elements. In this embodiment, the light emitting elements 40 are series-connected; however, they also may be parallel-connected.

Referring to FIG. 3(B), the side surface of the first side 32A consists of the first side surface 46 which is adjacent and inclined outward from the top surface and the second side surface 48 which is adjacent and inclined outward from the bottom surface in the metal substrate 32. And, same as above mentioned, the width of the first side surface 46 is formed more narrowly than the second side surface 48. Because the width of the first side surface 46 is made narrowly, the left end of the insulating layer 36 and the conductive pattern 34 can be kept apart enough and the dimensional size of the metal substrate 32 can be restrained. The distance L12 between the left end of the insulating layer 36 and the conductive pattern 34 is, for instance, about 0.8 mm or more.

It is not shown in these figures, but the structure of the second side 32B of the metal substrate 32 shown in FIG. 3(A) is same as the first side 32A.

Referring to FIG. 3(C), the first side surface 46 is formed larger than the second side surface 48 of the third side 32 C and the forth side 32 D in the longer direction.

The Second Embodiment

Manufacturing Method for Circuit Substrates and Circuit Devices

Figure 4A:
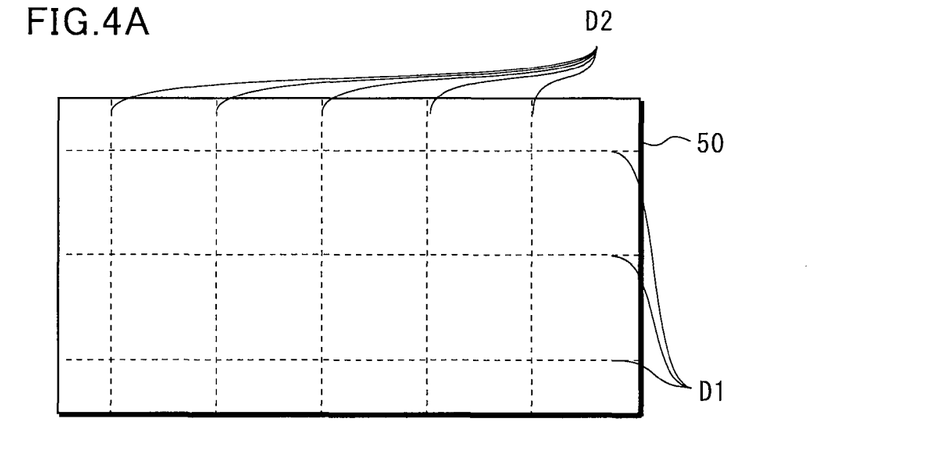
Figure 4B:
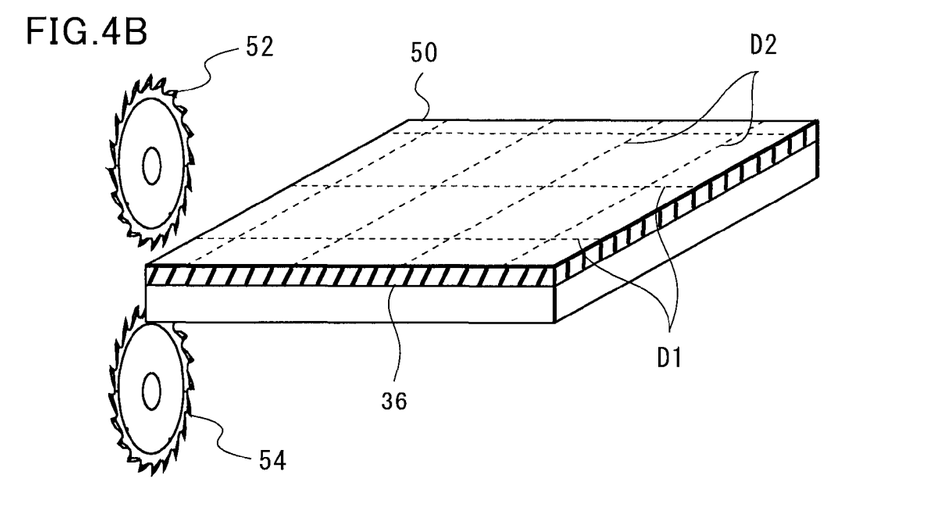
Figure 4C:
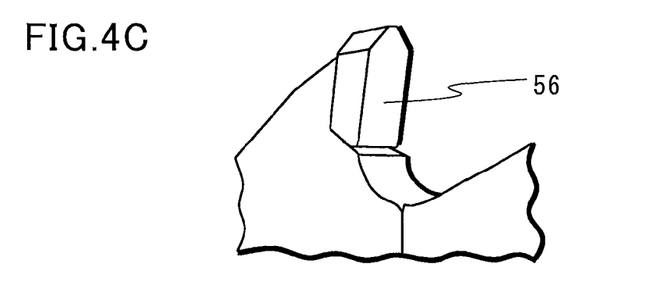

In this embodiment, referring to FIG. 4 and followings, it explains manufacturing method for circuit substrates and circuit devices.

Referring to FIG. 4, first of all, the groove which has a shape of V-type in cross section is formed on the both top and bottom surface of a large scale substrate 50. Referring to FIG. 4 (A), the substrate 50 is a large size substrate on which a lot of circuit substrates are able to be formed and the dicing line is provided in a grid according to the size of the circuit substrate formed thereon. Here, dicing line D1 is provided in a lateral direction and dicing line D2 is provided in a longitudinal direction. Resin material such as glass epoxy, etc. and ceramic may be adopted as material of the substrate 50 though the substrate that consists of metal such as aluminum, etc. is adopted as the substrate 50 here.

Referring to FIG. 4 (B), a groove which has V-type shape in cross section on the top and bottom surface of the substrate 50 is created by performing the dicing along the above mentioned dicing line with the use of a cut saw 52 and 54. Here, the grooves are formed on the top surface and bottom surface of the substrate 50 at the same time with the use of the cut saw 52 and 54 that rotates at high speed along dicing line D1. After finishing the dicing along dicing line D1, dicing is performed along dicing line D2. In this process, the grooves in a grid on the top surface and bottom surface of substrate 50 are formed. Moreover, referring to FIG. 4(C), an edge of the blade 56 of the cut saw 52 and 54 has the shape of V-type corresponding to the shape of the formed groove. Although the grooves are formed at the same time here, grooves on the top surface and the back surface may be formed separately.

Figure 5A:
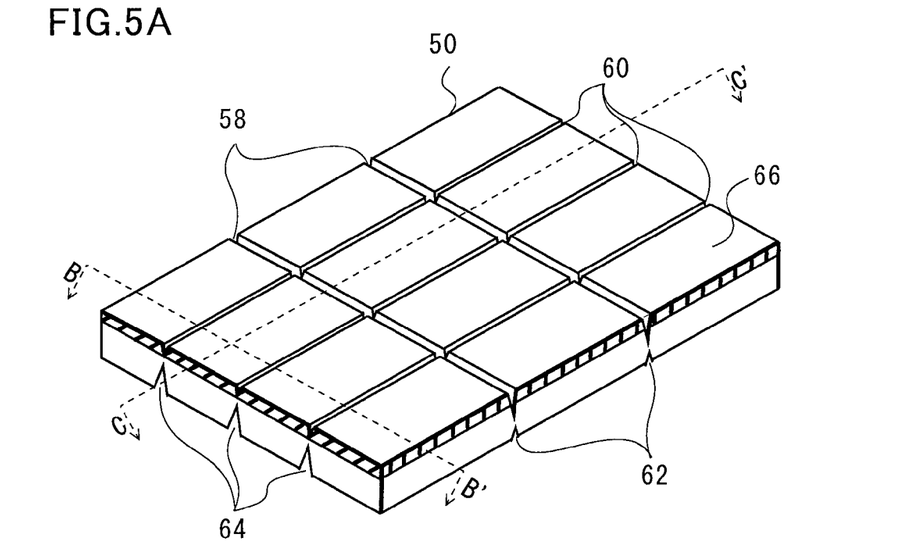
Figure 5B:
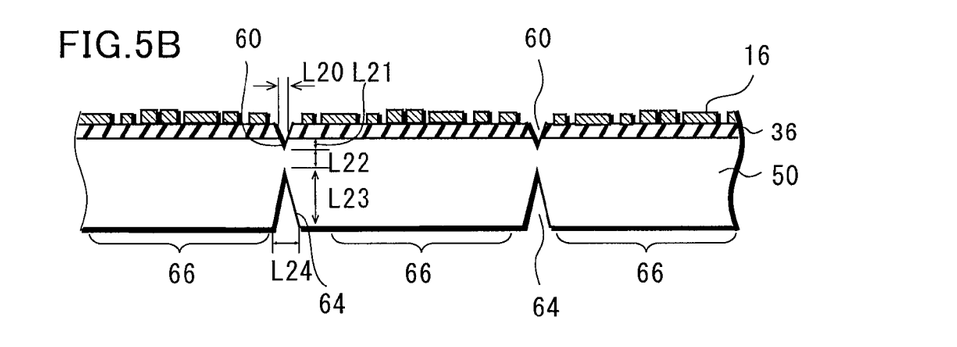
Figure 5C:
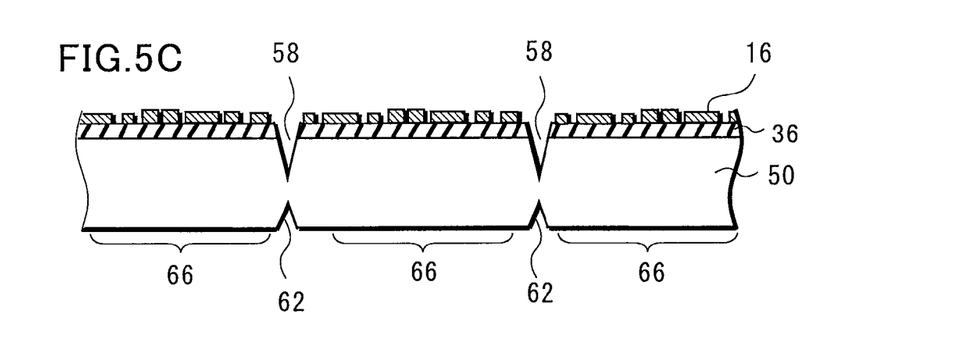

Referring to FIG. 5, it explains the shape of the substrate 50 on which the groove is created in the above mentioned process. FIG. 5 (A) is the oblique view showing the substrate 50 on which the groove is created in the above mentioned process, FIG. 5(B) is the cross section view on the line between B and B' in FIG. 5(A), and FIG. 5(C) is the cross section view on the line between C and C' in FIG. 5(C).

Referring to FIG. 5(B), the first groove 58 and the second groove 60 are formed in a grid on the top surface of the substrate 50. Here, the second groove 60 is formed more shallowly than the first groove 58. The third groove 62 and the forth groove 64 are formed on the part of the bottom surface where the first groove 58 and the second groove 60 on the top surface are corresponding. Here, the third groove 62 which is corresponding to the first groove 58 is formed more shallowly than the forth groove 64 which is corresponding to the second groove 60.

Also, the area enclosed by the first groove 58 and the second groove 60 on substrate 50 consists of one unit 66, and the same shape of a conductive pattern (not shown in the figures here) is formed in this each unit 66.

Referring to FIG. 5(B), the second groove 60 is formed on the top surface in the boundary of each unit 66, and the fourth groove 64 is formed on the bottom surface. Here, the second groove 60 is formed more shallowly than the fourth groove 64. Specifically, the width L20 of the second groove 60 formed shallowly is about 0.2 mm, and the depth L21 is about 0.2 mm. On the other hand, the width L24 of the fourth groove 64 formed on the bottom surface of the substrate 50 is about 0.8 mm, and the depth L23 is about 1.0 mm. Also, the thickness L22 of the remaining part where the substrate 50 is not cut as groove when creating groove is about 0.4 mm.

Referring to FIG. 5(C), here, the first groove 58 formed on the top surface is formed more deeply than the third groove 62 formed on the bottom surface. Here, the size of the first groove 58 may be same as the fourth groove 64 shown in FIG. 5(B), and the size of the third groove 62 may be same as the second groove 60 shown in FIG. 5(B).

Figure 6A:
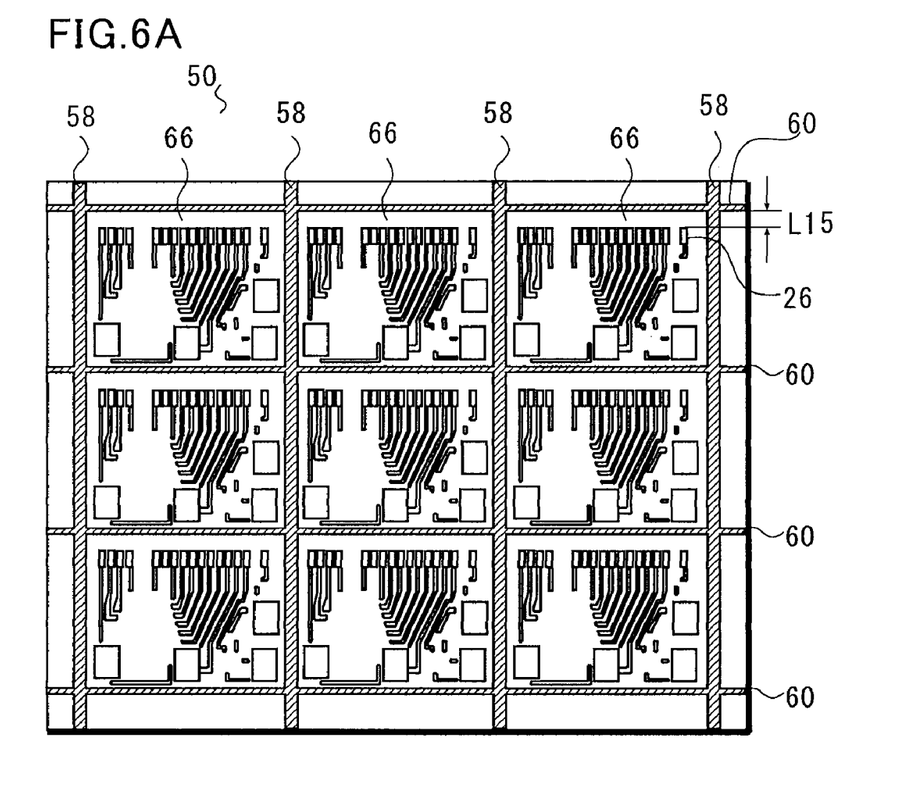
Figure 6B:
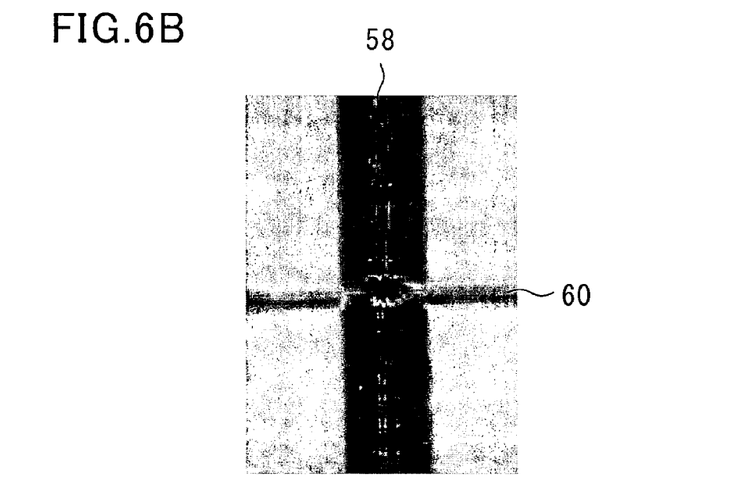

Referring to FIG. 6, it explains the structure of the substrate 50 on which each groove is formed in the above mentioned process. FIG. 6(A) is the plan view where substrate 50 is shown, and FIG. 6(B) is the picture that depicts the part where the first groove 58 and the second groove 60 intersect.

Referring to FIG. 6 (A), according to the boundary of each unit 66 formed on the substrate 50, the first groove 58 and the second groove 60 are formed in a grid. In this figure here, the first groove 58 which has the wide width about 0.8 mm is formed in longitudinal direction, and the second groove which has the narrow width about 0.2 mm is formed in lateral direction. And, each unit 66 is a long and slender rectangle in lateral direction in this figure, and a lot of pads 26 are formed along the upper side. It means that the second groove 60 which is narrow is formed along the longer direction of a unit 66 where the pads 26 are arranged. It makes the pads 26 distant from the edge of the unit 66 because the area that the second groove 60 which is narrow occupies small area. In other words, the width of the second groove 60 extending in the lateral direction is so narrow that a long distance can be secured between the leads (or the pads for the leads) and the second groove 60. This long distance can improve the withstand voltage between the leads and the substrate.

Additionally, in the case of FIG. 6, since grooves with a narrow width are formed in long sides of each unit, a mounting area on a surface of the metal substrate can be made large. In contrast, the grooves in long sides of each unit have a wide width in FIG. 3. Hence, this configuration does not contribute to enlargement of the mounting area on the metal substrate. However, this configuration ensures a long distance between an Al exposed portion on a side surface of the metal substrate and a lead terminal provided on a right or left side. Here, this configuration is employed because improvement in the withstand voltage is given higher priority than enlargement of the mounting area.

Referring to FIG. 6 (B), in this process, because the depth and the width of the first groove 58 and the second groove 60 are greatly different, generation of metallic burr is restrained in the portion where the both grooves intersect. Also, even if metallic burr is generated there, the amount is extremely little compared with previous structures. Therefore, short, etc. originating from generation of electric conductive metallic burr is restrained. In addition, referring to FIG. 6 (B), the hole portion that penetrates through the substrate 50 is formed by the intersection of the fourth groove 64 (refer to FIG. 5(B)) formed under the second groove 60 and the first groove 58.

Here, referring to FIG. 5 (B) and FIG. 5(C). the generation of metallic burr can be restrained further by adjusting the depth of the first groove 58 and the fourth groove 64 formed deeply in the direction of the thickness. Concretely, the depth L23 of the fourth groove 64 shown in FIG. 5(B) may be a half of the thickness of the substrate 50 or less (for instance, 0.7 mm.) In addition, the thickness of the first groove 58 shown in FIG. 5(C) may similarly be about 0.7 mm. This made the combined length of both the first groove 58 and the fourth groove 64 shorter than the thickness of the substrate 50 (for instance, 1.5 mm) then, the hole where both grooves intersect shown in FIG (B) may not be created. Consequentially, the effect of decreasing metallic burr becomes higher. Moreover, the length L 22 of the part which remains under grooves (refer to FIG. 5(B)) is, for instance, about 0.6 mm by adjusting the depth of the fourth groove 64 in this manner.

Figure 7:
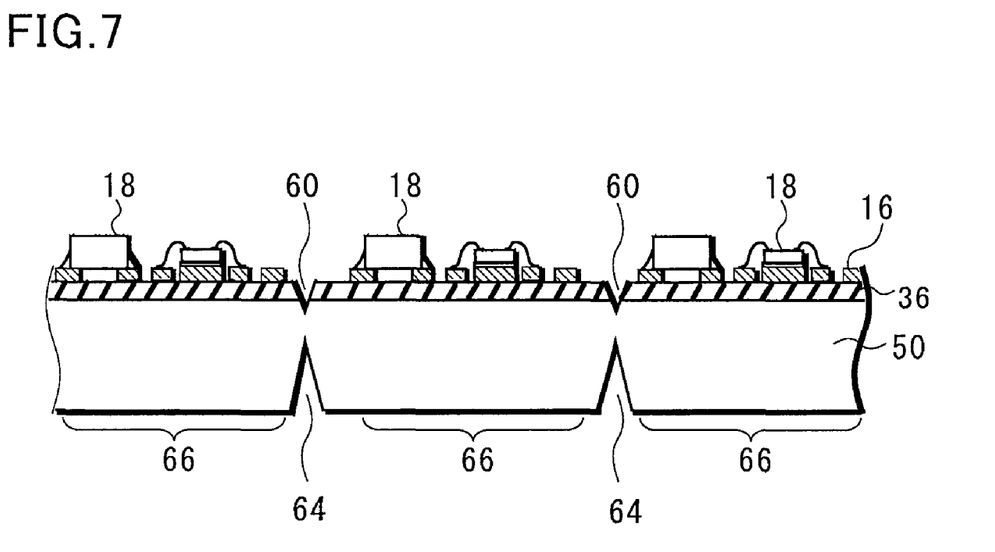
FIG. 7 is a cross section view where the process of manufacture of the circuit device in this invention is shown.

Next, referring to FIG. 7, the circuit elements 18 are arranged and connected in each unit on the substrate 50. Active elements such as transistors and ICs and passive elements such as chip resistances and chip capacitors are adopted as the circuit elements 18 mounted. Adhesive material of electroconductive such as electroconductive paste and solder, etc. is used for mounting of the circuit elements 18. Also, the electrodes and conductive patterns 16 formed on semiconductor elements are connected via metallic thin wire. Here, this process of mounting is performed in the condition that the each unit 66 has not been separated yet; however, it may be performed after each unit has been separated. In such process, the circuit substrate 10 of the structure shown in FIG. 1 is formed.

Figure 8A:
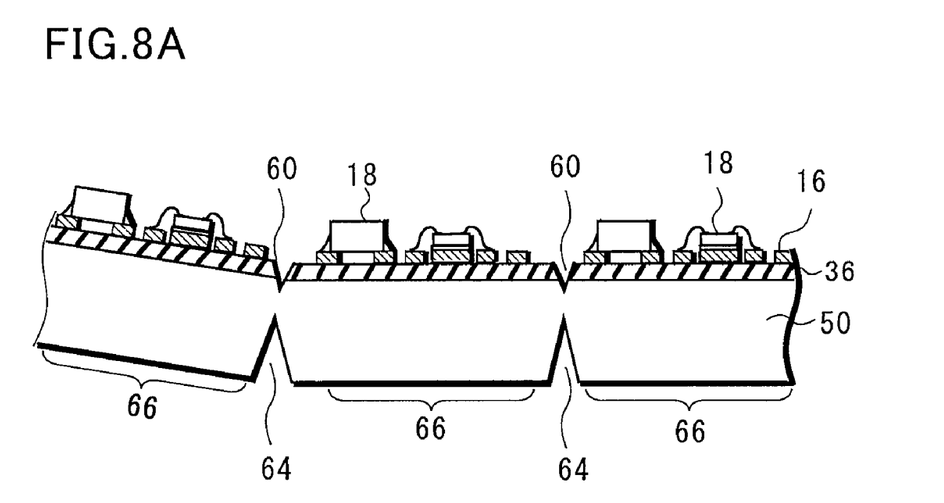
Figure 8B:
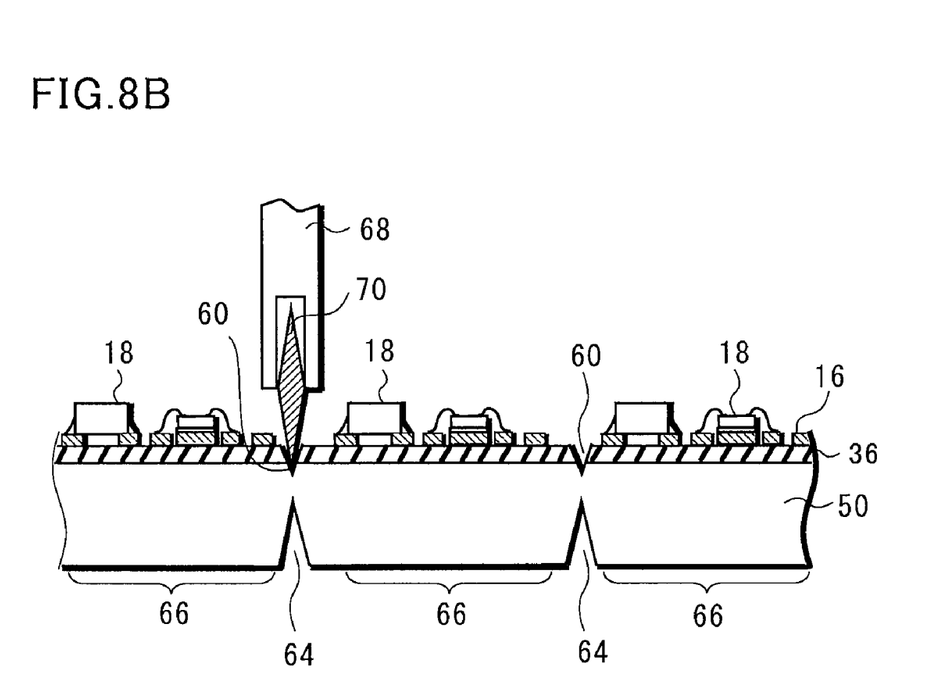

Next, referring to FIG. 8, the substrate 50 is separated into each unit 66. It is considered that the method to separate into each unit 66 should be the method that the substrate 50 is bent in the boundary between each unit 66 or the method of using a sharp cutter.

Referring to FIG. 8(A), It explains the method of separating individual unit 66 by bending the substrate 50. In this method, the substrate 50 is partially bent so that the portion where the second grove 60 and the fourth groove 64 in the left side in this figure were formed may become a fulcrum. Because the portion where the second groove 60 on the top surface and the fourth groove 64 on the back surface were formed becomes thinner than a remaining portion, the substrate 50 may be easily separated from this connecting portion by bending it in this part. Moreover, when bending, the side surface of the substrate 50 should be protected so as not to destroy the electric circuit formed on the substrate 50.

Referring to FIG. 8(B), it explains the method of separating the substrate 50 with a round cutter 70. The round cutter 70 which is disk-shaped and forms a sharp edge is rotatably connected with a supporting part 68. And, the thickness of the portion of the remaining of the substrate 50 between the second groove 60 and the fourth groove 64 is removed by moving the supporting part 68 while holding the round cutter 70 to the second groove 60.

Moreover, the separation of the above mentioned unit 66 is performed in the portion where the first groove 58 and the third groove 62 shown in FIG. 5(A) were formed. In addition, laser irradiation and piercing, etc. may be adopted as a method of separating each unit 66 besides the above mentioned method.

Figure 9:
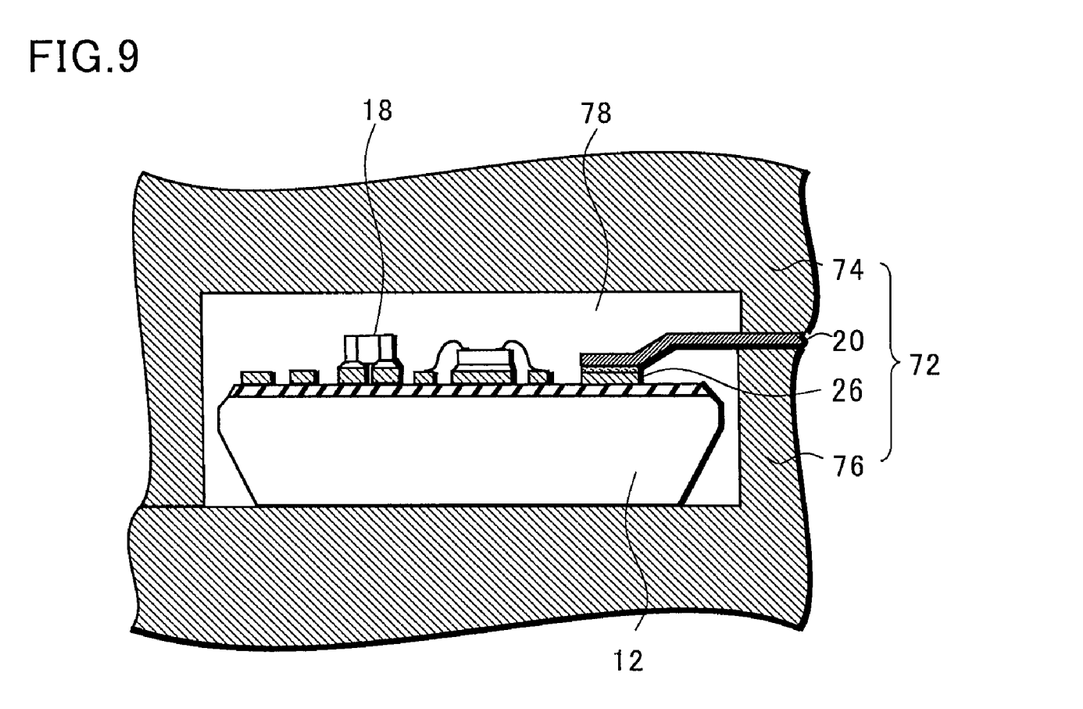
FIG. 9 is a cross section view where the process of manufacture of the circuit device in this invention is shown.

Next, referring to FIG. 9, the metal substrate 12 separated by the above mentioned process is sealed. In this process, the circuit element 18 and the metal substrates 12 are sealed by the transfer molding that uses a metal mold 72 that consists of the upper metal mold 74 and the under metal mold 76.

First of all in this process, the pads 26 formed on the top surface of the metal substrate 12 are connected to leads 20 via solder, then, the metal substrate 12 is placed in a cavity 78 of the metal mold 72. Next, the top surface and the side surface of the circuit element 18 and metal substrate 12 are sealed by injecting a liquid thermosetting resin from the gate not shown in this figure into the cavity 78. Here, the sealing structure which applies a casing material may be adopted instead of the resin sealed by the sealing resin 28.

By the above mentioned process, the structure of the hybrid integrated circuit device 30 shown in FIG. 2 is manufactured. Also, the process of manufacture of the circuit device 31 shown in FIG. 3 is also basically similar to the above mentioned process. Generally, a conductive pattern on the metal substrate is formed in a single layer. However, it is a matter of course that the conductive pattern may be formed in multiple layers or partly in multiple layers.

What is claimed is:

1. A circuit substrate comprising:
   a metal substrate comprising a top surface, a bottom surface, a first side surface and a second side surface;
   an insulating layer covering the top surface of the metal substrate; and
   a conductive pattern formed on the insulating layer,
   wherein the first side surface comprises a first inclining side surface inclining from the top surface and a second inclining side surface inclining from the bottom surface, and the first inclining side surface is shorter in a corresponding inclining direction thereof than the second inclining side surface in a corresponding inclining direction thereof, and
   the second side surface comprises a third inclining side surface inclining from the top surface and a fourth inclining side surface inclining from the bottom surface, and the third inclining side surface is longer in a corresponding inclining direction thereof than the fourth inclining side surface in a corresponding inclining direction thereof.

2. The circuit substrate of claim 1, further comprising a pad electrode formed on the insulating layer adjacent the first inclining side surface so that no other part of the conductive pattern is disposed between the pad electrode and the first inclining side surface.

3. The circuit substrate of claim 1, further comprising a circuit element disposed on the insulating layer and connected to the conductive pattern.

4. The circuit substrate of claim 2, further comprising a lead attached to the pad electrode.

5. The circuit substrate of claim 3, further comprising a sealing resin covering the circuit element and the insulating layer.

6. A circuit substrate comprising:
   a metal substrate comprising a top surface, a bottom surface, a first side surface and a second side surface;
   an insulating layer covering the top surface of the metal substrate; and
   a conductive pattern formed on the insulating layer,
   wherein the first side surface comprises a first inclining side surface inclining from the top surface, the second side surface comprises a second inclining side surface inclining from the top surface, and the first inclining side surface is shorter in a corresponding inclining direction thereof than the second inclining side surface in a corresponding inclining direction thereof.

7. The circuit substrate of claim 6, wherein the first side surface comprises a third inclining side surface inclining from the bottom surface, the second side surface comprises a fourth inclining side surface inclining from the bottom surface, and the third inclining side surface is longer in a corresponding inclining direction thereof than the fourth inclining side surface in a corresponding inclining direction thereof.

8. The circuit substrate of claim 6, further comprising a circuit element disposed on the insulating layer and connected to the conductive pattern.

9. The circuit substrate of claim 8, wherein the circuit element comprises a light emitting element.

10. The circuit substrate of claim 9, further comprising a sealing resin covering the light emitting element and the insulating layer.

11. A circuit substrate comprising:
    a metal substrate comprising a top surface, a bottom surface, a first side surface, a second side surface opposite from the first side surface, a third side surface and a fourth side surface opposite from the third side surface;
    an insulating layer covering the top surface of the metal substrate; and
    a conductive pattern formed on the insulating layer,
    wherein the first side surface comprises a first inclining side surface inclining from the top surface, the second side surface comprises a second inclining side surface inclining from the top surface, the third side surface comprises a third inclining side surface inclining from the top surface, the fourth side surface comprises a fourth inclining side surface inclining from the top surface, and the first and second inclining side surfaces are shorter in corresponding inclining directions thereof than the third and fourth inclining side surfaces in corresponding inclining directions thereof.

12. The circuit substrate of claim 11, wherein the first side surface comprises a fifth inclining side surface inclining from the bottom surface, the second side surface comprises a sixth inclining side surface inclining from the bottom surface, the third side surface comprises a seventh inclining side surface inclining from the bottom surface, the fourth side surface comprises a eight inclining side surface inclining from the bottom surface, and the fifth and sixth inclining side surfaces are longer in corresponding inclining directions thereof than the seventh and eighth inclining side surfaces in corresponding inclining directions thereof.

13. A semiconductor device comprising:
- a metal substrate comprising a top surface, a bottom surface and four side surfaces, the top surface being insulated;
- a conductive pattern insulated from the metal substrate; and
- a semiconductor element mounted on and electrically connected to the conductive pattern, wherein each of the side surfaces of the metal substrate comprises a first inclining side surface and a second inclining side surface so as to form a convex shape protruding outwardly between the top surface and the bottom surface of the metal substrate; and
- the first inclining side surfaces of a pair of two opposing side surfaces are smaller than corresponding first inclining side surfaces of another pair of two opposing side surfaces.

14. The semiconductor device of claim 13, wherein the metal substrate and the semiconductor element are covered with a sealing resin, and an input-output pad that is part of the conductive pattern is provided at least on one of the two opposing side surfaces of the pair.

15. The semiconductor device of claim 14, wherein the pad is provided in plurality on at least one of the two opposing side surfaces of the particular pair
- wherein the metal substrate and the semiconductor element are covered with a sealing resin, and a plurality of input-output pads that are part of the conductive pattern are provided at least on one of the two opposing side surfaces of the pair.

16. The semiconductor device of claim 13, wherein the semiconductor element comprises an LED or a switching element that is used for an inverter circuit.

17. The circuit substrate of claim 6, wherein the metal substrate is elongated in a direction, and a plurality of light emitting elements are disposed on the metal substrate so as to align in the direction of elongation of the metal substrate.

18. The circuit substrate of claim 17, wherein the light emitting elements are connected serially.

19. The circuit substrate of claim 11, wherein the metal substrate is elongated in a direction, and a plurality of light emitting elements are disposed on the metal substrate so as to align in the direction of elongation of the metal substrate.

20. The circuit substrate of claim 19, wherein the light emitting elements are connected serially.

21. The semiconductor device of claim 13, wherein the metal substrate is elongated in a direction, and a plurality of light emitting elements are disposed on the metal substrate so as to align in the direction of elongation of the metal substrate.

22. The semiconductor device of claim 21, wherein the light emitting elements are connected serially.

* * * * *